(12) United States Patent
Liu et al.

(10) Patent No.: US 11,107,689 B2
(45) Date of Patent: Aug. 31, 2021

(54) METHOD FOR FABRICATING SEMICONDUCTOR DEVICE

(71) Applicant: UNITED MICROELECTRONICS CORP., Hsin-Chu (TW)

(72) Inventors: Shi-You Liu, Kaohsiung (TW); Tsai-Yu Wen, Tainan (TW); Ming-Shiou Hsieh, Chiayi County (TW); Rong-Sin Lin, Taichung (TW); Ching-I Li, Tainan (TW); Neng-Hui Yang, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/207,201

(22) Filed: Dec. 3, 2018

(65) Prior Publication Data

US 2020/0144064 A1 May 7, 2020

(30) Foreign Application Priority Data

Nov. 2, 2018 (TW) .................................. 107138943

(51) Int. Cl.
| | |
|---|---|
| *H01L 21/8238* | (2006.01) |
| *H01L 21/28* | (2006.01) |
| *H01L 21/02* | (2006.01) |
| *H01L 21/265* | (2006.01) |
| *H01L 21/324* | (2006.01) |

(52) U.S. Cl.
CPC .... *H01L 21/28238* (2013.01); *H01L 21/0206* (2013.01); *H01L 21/2652* (2013.01); *H01L 21/324* (2013.01); *H01L 21/823892* (2013.01)

(58) Field of Classification Search
CPC .......... H01L 21/28238; H01L 21/2652; H01L 21/0206; H01L 21/8238–823892; H01L 27/0922
See application file for complete search history.

(56) References Cited

U.S. PATENT DOCUMENTS

| | | | |
|---|---|---|---|
| 6,403,425 B1* | 6/2002 | Ang | H01L 21/823857 257/E21.639 |
| 8,846,510 B2 | 9/2014 | Chuang et al. | |
| 2007/0187797 A1* | 8/2007 | Kato | H01L 21/823892 257/500 |
| 2009/0261446 A1* | 10/2009 | Gogoi | H01L 21/82385 257/500 |
| 2012/0045874 A1* | 2/2012 | Xiong | H01L 21/823857 438/217 |
| 2013/0105905 A1* | 5/2013 | Ji | H01L 29/513 257/369 |
| 2014/0103429 A1* | 4/2014 | Chuang | H01L 29/66681 257/335 |

(Continued)

*Primary Examiner* — Lauren R Bell
(74) *Attorney, Agent, or Firm* — Winston Hsu

(57) ABSTRACT

A method for fabricating semiconductor device includes the steps of: providing a substrate having a NMOS region and a PMOS region; forming a pad oxide layer on the substrate, wherein the pad oxide layer comprises a first thickness; performing an implantation process to inject germanium (Ge) into the substrate on the PMOS region; performing a first cleaning process to reduce the first thickness of the pad oxide layer on the PMOS region to a second thickness; performing an anneal process; and performing a second cleaning process to remove the pad oxide layer.

12 Claims, 3 Drawing Sheets

(56) References Cited

U.S. PATENT DOCUMENTS

| | | | |
|---|---|---|---|
| 2014/0183649 A1* | 7/2014 | Lee | H01L 27/092 257/369 |
| 2014/0361376 A1* | 12/2014 | Lii | H01L 29/42364 257/369 |
| 2016/0148847 A1* | 5/2016 | Lee | H01L 21/823857 438/199 |
| 2018/0350607 A1* | 12/2018 | Shu | H01L 21/76897 |
| 2018/0366546 A1* | 12/2018 | Sung | H01L 29/1054 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method of conducting cleaning process to lower the thickness of pad oxide layer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, compound such as germanium oxide (GeO) is often found in pad oxide layer before the formation of well region and the presence of GeO typically affects the performance of the device substantially. Hence, how to resolve this issue has become an important task in this field.

SUMMARY OF THE INVENTION

According to an embodiment of the present invention, a method for fabricating semiconductor device includes the steps of: providing a substrate having a NMOS region and a PMOS region; forming a pad oxide layer on the substrate, wherein the pad oxide layer comprises a first thickness; performing an implantation process to inject germanium (Ge) into the substrate on the PMOS region; performing a first cleaning process to reduce the first thickness of the pad oxide layer on the PMOS region to a second thickness; performing an anneal process; and performing a second cleaning process to remove the pad oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
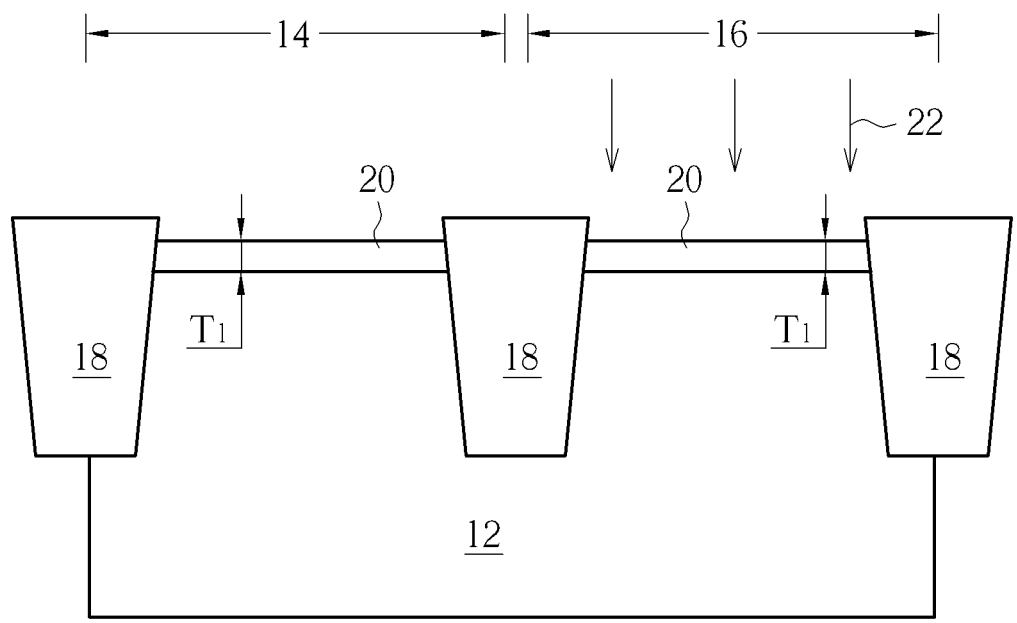
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 such as silicon substrate or silicon-on-insulator (SOI) substrate is provided, a NMOS region 14 and a PMOS region 16 are defined on the substrate 12, and a shallow trench isolation 18 is formed in the substrate 12 to separate the NMOS region 14 and PMOS region 16. It should be noted that even though the present embodiment pertains to fabricate planar field effect transistors, according to other embodiment of the present invention, it would also be desirable to apply the following process to fabricate non-planar field effect transistors such as fin field effect transistors (FinFETs), which is also within the scope of the present invention.

Next, a pad oxide layer 20 is formed on the surface of the substrate 12 on NMOS region 14 and PMOS region 16, in which the pad oxide layer 20 on both NMOS region 14 and PMOS region 16 includes a first thickness $T_1$. In this embodiment, the first thickness $T_1$ is preferably between 100 Angstroms to 120 Angstroms or most preferably at 110 Angstroms. Next, an ion implantation process 22 is conducted to implant germanium ions into the substrate 12 on the PMOS region 16.

Figure 2:
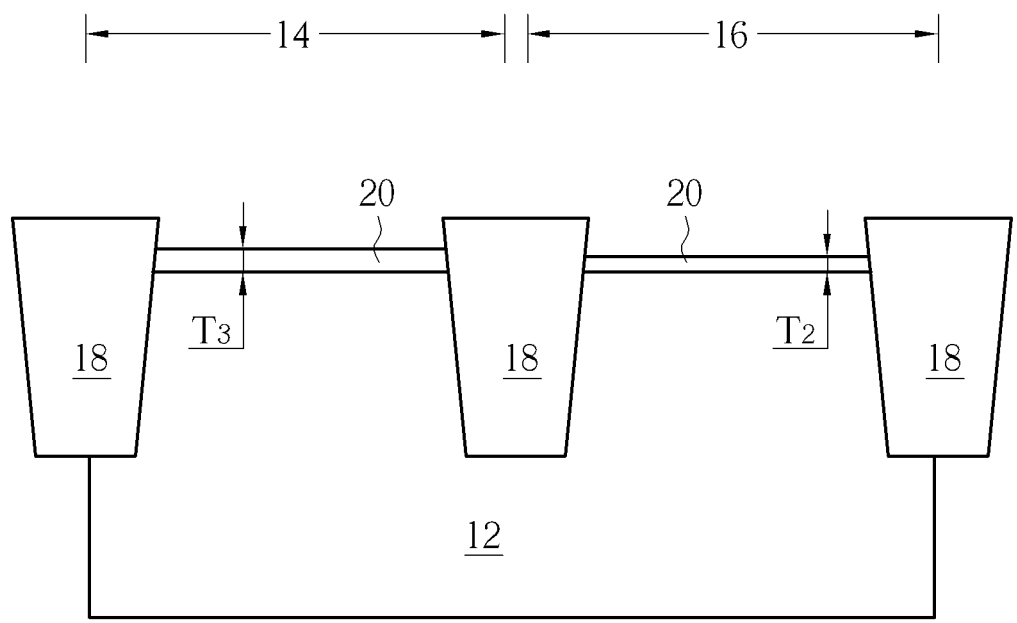

Next, as shown in FIG. 2, a first cleaning process is conducted to remove part of the pad oxide layer 20 on both NMOS region 14 and PMOS region 16 without forming any patterned mask. It should be noted that since germanium ions have been implanted into the substrate 12 and even part of the pad oxide layer 20 on PMOS region 16 in the previous step, the first cleaning process conducted at this stage preferably removes more pad oxide layer 20 on the PMOS region 16 and less pad oxide layer 20 on the NMOS region 14. In other words, after the first cleaning process is completed, the first thickness $T_1$ of the pad oxide layer 20 on PMOS region 16 is preferably lowered to a second thickness $T_2$ while the first thickness $T_1$ of the pad oxide layer 20 on MOS region 14 is lowered to a third thickness $T_3$. In this embodiment, the remaining second thickness $T_2$ of the pad oxide layer 20 on PMOS region 16 is preferably between 30 Angstroms to 70 Angstroms or most preferably at 50 Angstroms and the second thickness $T_2$ is also slightly less than the third thickness $T_3$ on NMOS region 14. In this embodiment, the cleaning agent used in the first cleaning process preferably includes but not limited to for example diluted hydrofluoric acid (dHF) and a ratio of hydrofluoric acid to distilled water in dHF is between 20:1 to 2000:1.

Figure 3:
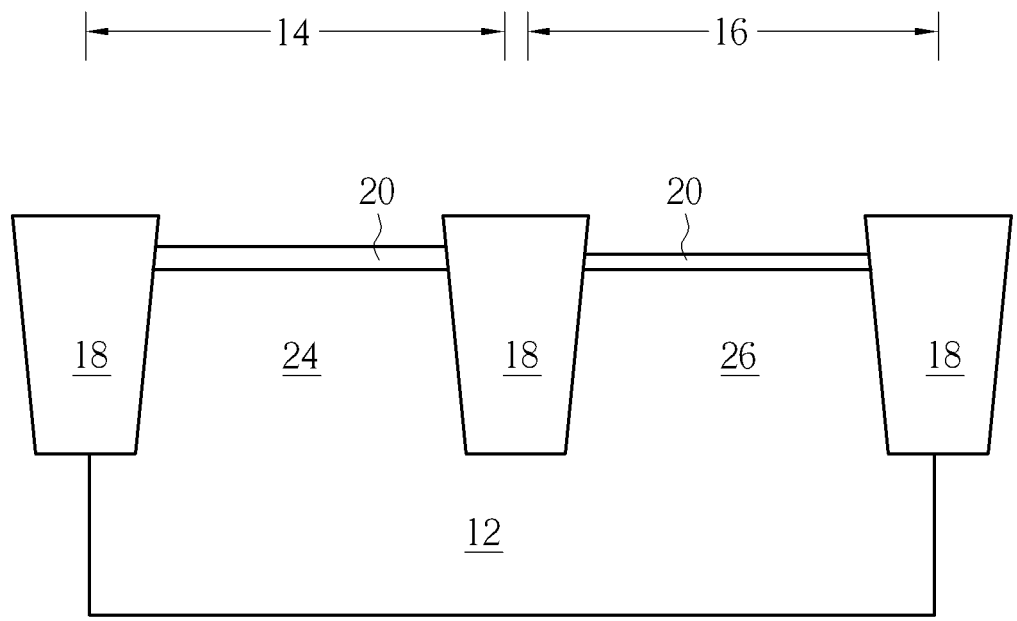

Next, as shown in FIG. 3, additional ion implantation processes are conducted to implant p-type dopants into the substrate 12 on NMOS region 14 and n-type dopants into the substrate 12 on PMOS region 16, and an anneal process is conducted to diffuse the implanted dopants for forming a p-well 24 and a n-well 26. In this embodiment, the anneal process is preferably conducted under a non-oxygen environment or more specifically a nitrogen ambient or environment, and a temperature of the anneal process is between 1000° C. to 1100° C. or most preferably at 1050° C.

Figure 4:
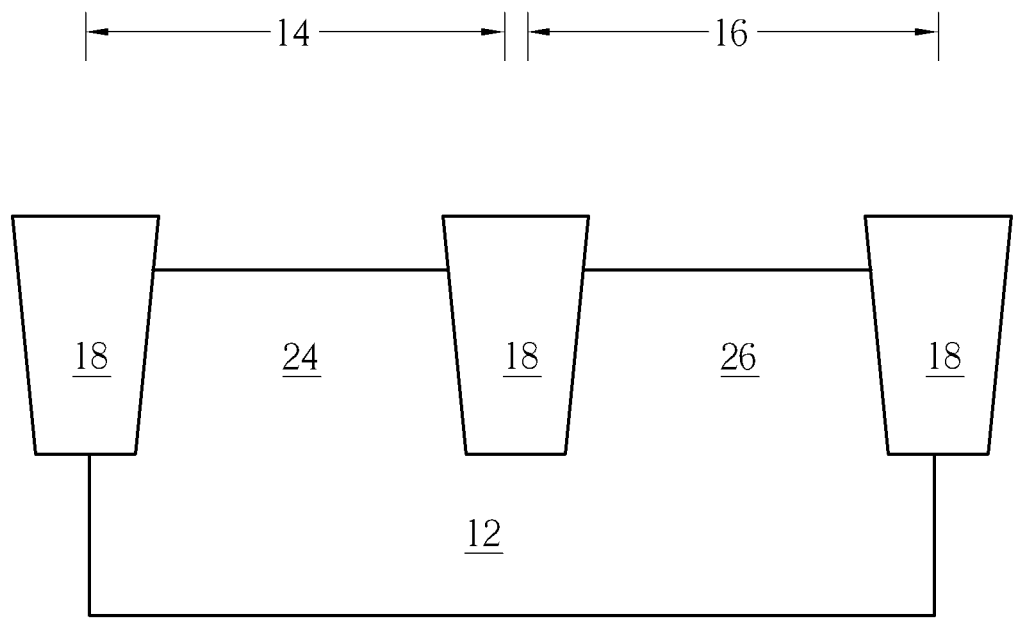

Next, as shown in FIG. 4, a second cleaning process is conducted to remove the pad oxide layer 20, or more specifically using a first cleaning agent and a second cleaning agent to remove the pad oxide layer 20 on both NMOS region 14 and PMOS region 16 completely and expose the surface of the substrate 12. In this embodiment, the first cleaning agent is selected from the group consisting of ammonia ($NH_3$), hydrofluoric acid (HF), and argon (Ar) and the second cleaning agent includes diluted hydrofluoric acid (dHF). In this embodiment, the flow of $NH_3$ from the first cleaning agent is preferably at 80 sccm, the flow of HF is at 80 sccm, the flow of argon is at 107 sccm, and a ratio of hydrofluoric acid to distilled water in dHF is about 100:1.

Figure 5:
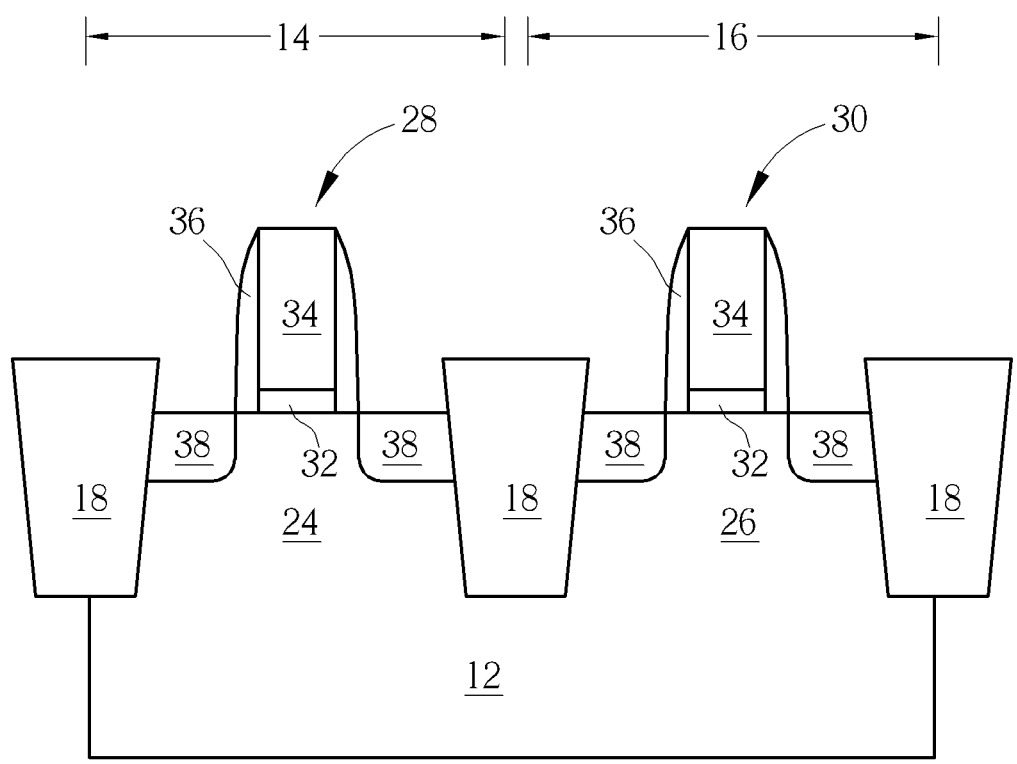

Next, as shown in FIG. 5, a gate dielectric layer is formed on the substrate 12 on both NMOS region 14 and PMOS region 16 after the second cleaning process is completed. Next, transistor fabrication process could be continued thereafter by first forming gate structures 28, 30 or dummy gates on the substrate 12 on NMOS region 14 and PMOS region 16. In this embodiment, the formation of the gate structures 28, 30 could be accomplished by a gate first process, a high-k first approach from gate last process, or a high-k last approach from gate last process. Since this embodiment pertains to a gate first approach, a gate dielectric layer 32 or interfacial layer, a gate material layer 34 made of polysilicon, and a selective hard mask (not shown) could be formed sequentially on the substrate 12, and a photo-etching process is then conducted by using a patterned resist (not shown) as mask to remove part of the gate material layer 34 and part of the gate dielectric layer 32 through single or multiple etching processes. After stripping the patterned resist, gate structures 28, 30 each composed of a patterned gate dielectric layer 32 and a patterned material layer 34 are formed on the substrate 12.

Next, at least a spacer 36 is formed on the sidewalls of the each of the gate structures 28, 30, a source/drain region 38 and/or epitaxial layer is formed in the substrate 12 adjacent to two sides of the spacers 36, and selective silicide layers (not shown) could be formed on the surface of the source/drain regions 38. In this embodiment, the spacer 36 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 38 could include n-type dopants or p-type dopants depending on the type of device being fabricated. For instance, the source/drain region 38 on the NMOS region 14 preferably includes n-type dopants and or epitaxial material made of silicon phosphide (SiP) whereas the source/drain region 38 on the PMOS region 16 includes p-type dopants and/or epitaxial material made of silicon germanium (SiGe). Next, an interlayer dielectric (ILD) layer could be formed around the gate structures 28, 30 and contact plugs could be formed in the ILD layer to electrically connect the source/drain regions 38 on each of the NMOS region 14 and PMOS region 16. This completes the fabrication of a semiconductor device according to an embodiment of the present invention.

In current fabrication process, an ion implantation process is conducted after forming pad oxide layer and before forming well regions to implant germanium ions into the substrate on PMOS region to improve voltage stability of the device. The implanted germanium ions however usually react with oxygen atoms in the pad oxide layer to form compounds such as germanium oxide (GeO) and germanium dioxide ($GeO_2$), in which the insoluble GeO often affects the electrical performance of the device while the soluble $GeO_2$ presents no such problem.

Since a pad oxide layer with greater thickness has found to include both GeO and $GeO_2$ while thinner pad oxide layer would only include GeO, the present invention preferably conducts a cleaning process to reduce the thickness of the pad oxide layer on PMOS region after implanting germanium ions into the substrate on PMOS region so that the remaining pad oxide layer with reduced thickness would include only $GeO_2$ and no GeO thereby improving the stability of the device. It should also be noted that even though the pad oxide layer may include compound such as GeO which could influence the performance of the device, it would be undesirable to remove all of the pad oxide layer before forming the well regions since other impurities may enter the substrate and results in contamination. Consequently it would be desirable to remove only a portion of the pad oxide layer on NMOS region and PMOS region during the aforementioned cleaning process instead of removing the entire pad oxide layer from the substrate on each of the transistor regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a NMOS region and a PMOS region;
   forming a pad oxide layer on the substrate, wherein the pad oxide layer comprises a first thickness on the NMOS region and the PMOS region;
   performing an implantation process to inject germanium (Ge) into the substrate on the PMOS region while the pad oxide layer is on the PMOS region;
   performing a first cleaning process to thin the pad oxide layer on the PMOS region to a second thickness and the pad oxide layer on the NMOS region to a third thickness after performing the implantation process, wherein the second thickness is different than the third thickness;
   performing an anneal process after the first cleaning process, wherein the pad oxide layer on the PMOS has the second thickness and the pad oxide layer on the NMOS region has the third thickness during the anneal process; and
   after the anneal process, performing a second cleaning process to completely remove the pad oxide layer on the NMOS region and the PMOS region.

2. The method of claim 1, wherein the second thickness is less than the third thickness.

3. The method of claim 1, further comprising using diluted hydrofluoric acid (dHF) to perform the first cleaning process.

4. The method of claim 3, wherein a ratio of hydrofluoric acid to distilled water in the dHF is between 20:1 to 2000:1.

5. The method of claim 1, wherein a temperature of the anneal process is between 1000° C. to 1100° C.

6. The method of claim 1, further comprising performing the anneal process in a nitrogen gas ($N_2$) ambient.

7. The method of claim 6, further comprising performing the anneal process without oxygen gas ($O_2$).

8. The method of claim 1, further comprising using a first cleaning agent and a second cleaning agent to perform the second cleaning process.

9. The method of claim 8, wherein the first cleaning agent is selected from the group consisting of ammonia ($NH_3$), hydrofluoric acid (HF), and argon (Ar).

10. The method of claim 8, wherein the second cleaning agent comprises diluted hydrofluoric acid (dHF).

11. The method of claim 1, further comprising forming a gate dielectric layer on the substrate on the NMOS region and the PMOS region after performing the second cleaning process.

12. The method of claim 1, further comprising performing additional implantation processes after the first cleaning process and before the anneal process to implant p-type dopants through the pad oxide layer on the NMOS region and into the NMOS region, and to implant n-type dopants through the pad oxide layer on the PMOS region and into the PMOS region.

\* \* \* \* \*